United States Patent
Lu et al.

(10) Patent No.: US 7,319,048 B2
(45) Date of Patent: Jan. 15, 2008

(54) ELECTRONIC ASSEMBLIES HAVING A LOW PROCESSING TEMPERATURE

(75) Inventors: Daoqiang Lu, Chandler, AZ (US); Chuan Hu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 323 days.

(21) Appl. No.: 10/933,995

(22) Filed: Sep. 3, 2004

(65) Prior Publication Data

US 2006/0051898 A1   Mar. 9, 2006

(51) Int. Cl.
H01L 21/44 (2006.01)
(52) U.S. Cl. ..................... 438/106; 438/122
(58) Field of Classification Search ................ 257/625, 257/675, 706–707, 712–713; 438/122, 644, 438/652, 654, 660, 661, 761, 106
See application file for complete search history.

(56) References Cited

U.S. PATENT DOCUMENTS

| | | | |
|---|---|---|---|
| 6,833,289 B2 | 12/2004 | Hu et al. | 438/121 |
| 7,009,289 B2 | 3/2006 | Hu et al. | 257/706 |
| 2003/0102526 A1* | 6/2003 | Dias et al. | 257/618 |
| 2004/0164402 A1* | 8/2004 | Yoshimura | 257/706 |

OTHER PUBLICATIONS

So et al., "High Temperature Joints Manufactured at Low Temperature," 1998 Electronic Components and Technology Conference, 1998, pp. 284-291.

* cited by examiner

*Primary Examiner*—Tuan H. Nguyen
(74) *Attorney, Agent, or Firm*—Konrad Raynes & Victor, LLP; Alan S. Raynes

(57) ABSTRACT

Embodiments relate to electronic assemblies and methods for forming electronic assemblies. One method includes providing a die and a copper heat spreader that are to be coupled to one another through a thermal interface material. A layer of tin is formed on the copper heat spreader. The heat spreader and the die are clamped together with the tin positioned between the heat spreader and the die. The assembly is heated so that the tin melts and forms at least one intermetallic compound with copper from the heat spreader. The heat spreader is then coupled to the die through the intermetallic compound.

26 Claims, 5 Drawing Sheets

ELECTRONIC ASSEMBLIES HAVING A LOW PROCESSING TEMPERATURE

RELATED ART

Integrated circuits may be formed on semiconductor wafers that are formed from materials such as silicon. The semiconductor wafers are processed to form various electronic devices thereon. The wafers are diced into semiconductor chips, which may then be attached to a package substrate using a variety of known methods. In one known method for attaching a chip or die to a substrate, the die may have solder bump contacts which are electrically coupled to the integrated circuit. The solder bump contacts extend onto the contact pads of a package substrate, and are typically attached in a thermal reflow process. Electronic signals may be provided through the solder bump contacts to and from the integrated circuit.

Operation of the integrated circuit generates heat in the device. As the internal circuitry operates at increased clock frequencies and/or higher power levels, the amount of heat generated may rise to levels that are unacceptable unless some of the heat can be removed from the device. Heat is conducted to a surface of the die, and should be conducted or convected away to maintain the temperature of the integrated circuit below a predetermined level for purposes of maintaining functional integrity of the integrated circuit.

One way to conduct heat from an integrated circuit die is through the use of a heat spreader, which may be positioned above the die and thermally coupled to the die through a thermal interface material. Materials such as certain solders and adhesives may be used as thermal interface materials and to couple the heat spreader to the die.

BRIEF DESCRIPTION OF THE DRAWINGS

Embodiments are described by way of example, with reference to the accompanying drawings, which are not drawn to scale, wherein.

DETAILED DESCRIPTION

Figure 1:
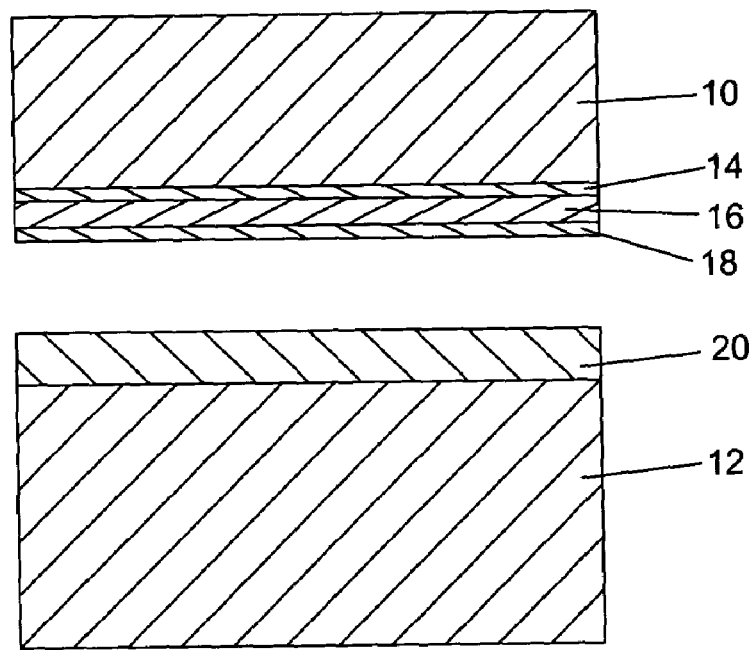
FIG. 1 is a cross-sectional side view of components of an electronic assembly in accordance with an embodiment, before being assembled and heated.

FIG. 1 illustrates a first embodiment. In this embodiment, a die 10 formed from a material such as silicon and having circuitry thereon is to be coupled to a body such as a heat spreader 12 formed from copper. The die may preferably have a thickness of about 150 µm to about 200 µm, and the heat spreader may preferably have a thickness of about 1.5 µm to about 2.5 mm. The die 10 may have one or more layers formed on the back surface thereof. When metal layers are used, these one or more layers may be known as the backside metallurgy on the die. In the embodiment shown in FIG. 1, the backside metallurgy includes, for example, three metal layers, including a titanium (Ti) layer 14, a nickel (Ni) layer 16, and a gold (Au) layer 18. In certain embodiments the Ti layer 14 is about 0.05 µm thick, the Ni layer 16 is about 0.35 µm thick, and the Au layer 18 is equal to or less than 0.05 µm thick. The titanium layer 14 may act as an adhesion layer on the die surface. Other possible adhesion layer materials include, but are not limited to, titanium nitride (TiN), tantalum (Ta), tantalum nitride (TaN), and chromium (Cr). The Ni layer 16 may act as a diffusion barrier to prevent interactions between the die material (for example, Si) and the thermal interface material. The Au layer 18 may act to protect the surface from oxidation and may promote the use of fluxless bonding.

The thermal interface material in the first embodiment is formed by depositing a layer of tin 20 on the heat spreader 12 and then coupling the heat spreader 12 with the tin layer 20 to the die 10 on the side having the backside metallurgy thereon. The tin layer may be formed on the heat spreader using a variety of techniques known in the art, including, but not limited to, plating, sputtering and evaporation. The heat spreader 12 with the tin layer 20 may be coupled to the die 10, for example, by using a clamp (not shown). The assembly, together with the clamp, is heated. The assembly is heated to a temperature greater than the melting point of the tin so that the tin wets the backside metallurgy on the die and bonds the die and the heat spreader together. The heating may be carried out by sending the clamped electronic assembly through a reflow furnace. The heating may be carried out in a variety of atmospheres, including, but not limited to, $N_2$. Preferably a flux material is not used. Temperatures in the range of about 230° C. to about 300° C. are preferred. The heating time may preferably be about 2-5 minutes. An annealing operation at about 230° C. to about 280° C. for additional time (for example, 1-3 hours) may be carried out if desired to ensure that all of the tin has been depleted in the thermal interface layer. Such an annealing process may be carried out in an annealing furnace. The annealing may be carried out in a variety of atmospheres, including, but not limited to, air.

The tin reacts with other metals to form intermetallic compounds. For example, the tin and copper react to form $Cu_6Sn_5$ and/or $Cu_3Sn$. The longer the heating process is conducted, the more $Cu_3Sn$ will be formed. Other intermetallics including tin-nickel and a small amount of tin-gold are also formed. These intermetallics all have a higher melting point than tin.

Figure 2:
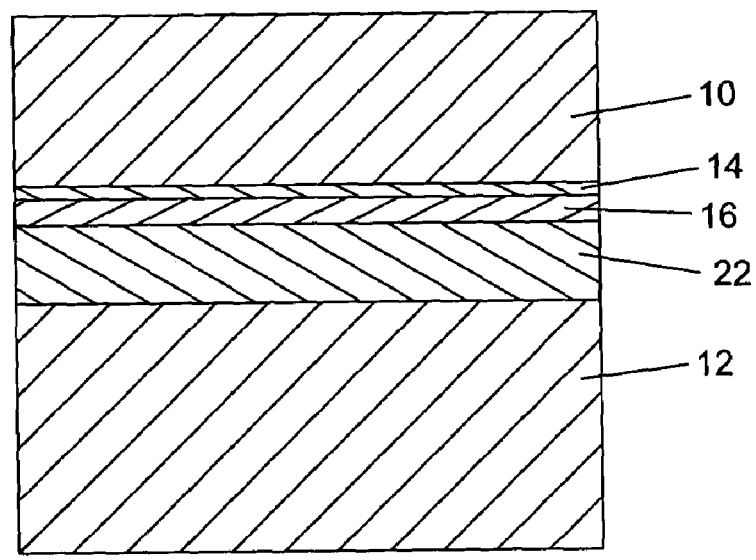
FIG. 2 is a view of the electronic assembly of FIG. 1, after heating of the assembly, in accordance with an embodiment.

When complete the heating yields a structure as shown in FIG. 2, including a thermal interface layer 22 between the heat spreader 12 and the remaining backside metallurgy on the die 10. The thermal interface layer 22 includes the intermetallics formed from tin and copper, tin and nickel, and tin and gold as described above. If the interface layer 22 includes $Cu_3Sn$, the $Cu_3Sn$ has a melting temperature of about 600° C. If the interface layer 22 includes $Cu_6Sn_5$, the $Cu_6Sn_5$ has a melting temperature of about 415° C. As the $Cu_3Sn$ has a higher melting temperature, in certain embodiments it is preferred. The backside metallurgy on the die 10 includes the titanium layer 14 and the remaining nickel layer

16. A portion of the nickel layer 16 and the gold layer 18 have been reacted with the tin.

Figure 3:
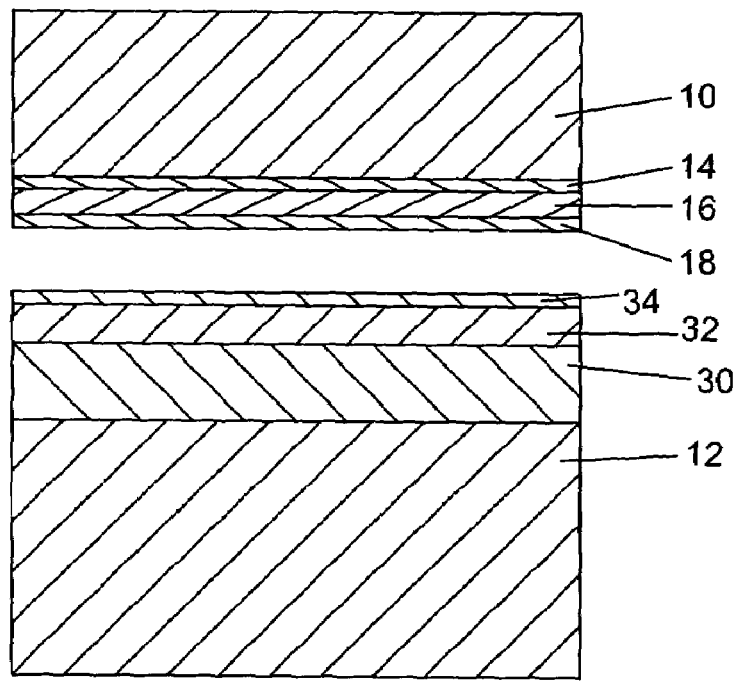
FIG. 3 is a cross-sectional side view of components of an electronic assembly in accordance with an embodiment, before being assembled and heated.

FIG. 3 illustrates another embodiment including a different thermal interface material than the embodiment shown in FIGS. 1-2. A die 10 may have backside metallurgy as in the embodiment shown in FIG. 1, with titanium, nickel, and gold layers thereon. The heat spreader 12 may be formed from copper and may have a layer 30 of silver (Ag) and a layer 32 of indium (In) thereon. A thin layer 34 of gold (Au) may be formed on the layer 32 of indium to inhibit oxidation and promote fluxless bonding. The thin layer 34 of gold is formed to a preferred thickness of 0.05 μm to 0.1 μm. The layers may be formed on the heat spreader 12 using a variety of techniques known in the art, including, but not limited to, plating, sputtering and evaporation. In certain embodiments is it preferred that the silver to indium mass ratio be 2.8 to 1 or greater and that the silver to indium layer thickness ratio be 2.0 to 1 or greater.

The die 10 and heat spreader 12 are coupled together and heated. The assembly is heated to a temperature greater than the melting point of the indium. The heating may be done using a reflow furnace and may be carried out in a variety of atmospheres, including, but not limited to, $N_2$. Preferably a flux material is not used. Temperatures in the range of about 200° C. to about 250° C. are preferred. The heating time may preferably be about 2-5 minutes. The indium reacts with other metals to form intermetallic compounds including one or more indium-silver intermetallics, and a small amount of one or more indium-gold intermetallics. It is also possible that a small amount of indium-nickel intermetallic may be formed. An annealing operation at about 140° C. to about 180° C. for additional time (for example, 10-24 hours) may be preferably carried out to ensure that all of the indium has been depleted. Such an annealing process may be carried out in an annealing furnace. The annealing may be carried out in a variety of atmospheres, including, but not limited to, air.

Figure 4:
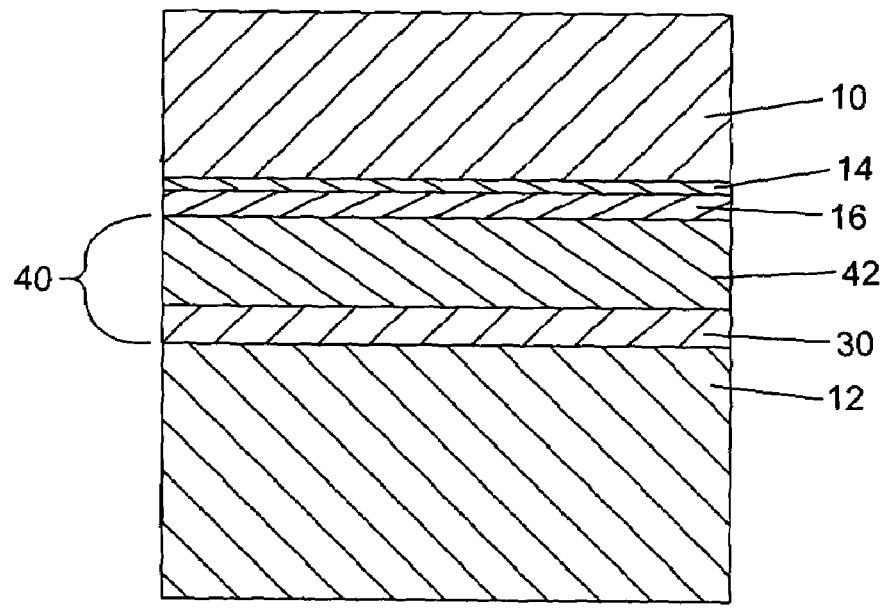
FIG. 4 is a view of the electronic assembly of FIG. 2, after heating of the assembly, in accordance with an embodiment.

When complete the heating yields a structure as shown in FIG. 4, including a thermal interface layer 40 between the heat spreader 12 and the remaining backside metallurgy on the die 10. The thermal interface layer 40 includes a layer 42 including the indium-silver and the indium-gold intermetallics, and layer 30 including the unreacted silver. The thermal interface layer 40 may also include a small amount of indium-nickel intermetallic at or near the interface of the thermal interface layer 40 and the nickel layer 16. An indium-silver intermetallic in the thermal interface layer 40 will have a melting temperature of about 700° C. The backside metallurgy on the die 10 includes the titanium layer 14 and the nickel layer 16 (a small amount of the nickel layer may react with the indium). The gold layer 18 and the gold layer 34 have been reacted with the indium.

Figure 5:
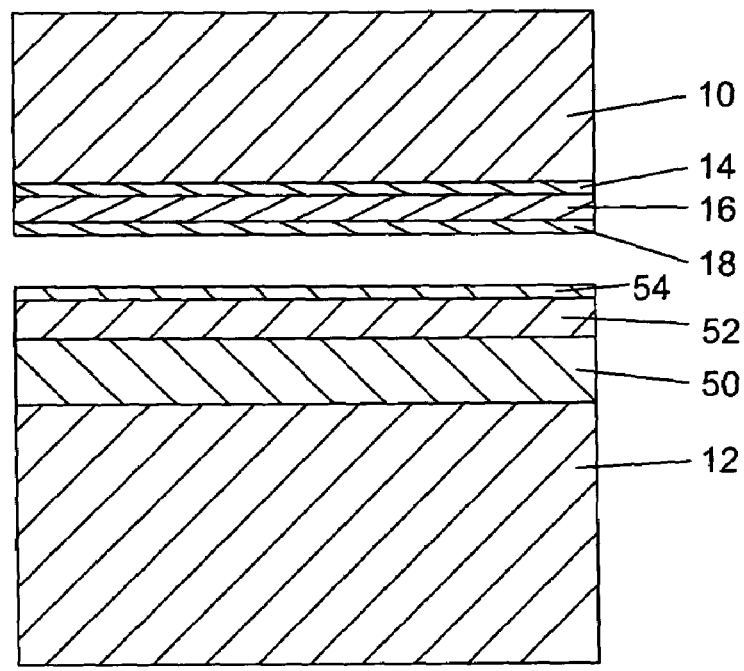
FIG. 5 is a cross-sectional side view of components of an electronic assembly in accordance with an embodiment, before being assembled and heated.

FIG. 5 illustrates another embodiment including a different thermal interface material than the embodiments described above. A die 10 may have backside metallurgy as in the embodiment shown in FIG. 1, with titanium, nickel, and gold layers thereon. The heat spreader 12 may be formed from copper and may include a layer 50 of gold and a layer 52 of indium thereon. A thin layer 54 of gold (Au) may be formed on the layer 52 of indium to inhibit oxidation and promote fluxless bonding. The thin layer 54 of gold is formed to a preferred thickness of 0.05 μm to 0.1 μm. The layers may for formed on the heat spreader 12 using a variety of techniques known in the art, including, but not limited to, plating, sputtering and evaporation. In certain embodiments it is preferred that the gold to indium mass ratio be 1.7 to 1 or greater and that the gold to indium layer thickness ratio be 0.65 to 1 or greater.

The die 10 and heat spreader 12 are coupled together and heated. The assembly is heated to a temperature greater than the melting point of the indium. The heating may be done using a reflow furnace and may be carried out in a variety of atmospheres, including, but not limited to $N_2$. Preferably a flux material is not used. Temperatures in the range of about 170° C. to about 250° C. are preferred. The heating time may preferably be about 2-5 minutes. The indium reacts with gold to form one or more indium-gold intermetallic compounds. It is also possible that a small amount of indium-nickel intermetallic may be formed. An annealing operation at about 160° C. to about 180° C. for additional time (for example, 1-5 hours) may be preferably carried out to ensure that all of the indium has been depleted. Such an annealing process may be carried out in an annealing furnace. The annealing may be carried out in a variety of atmospheres, including, but not limited to air.

Figure 6:
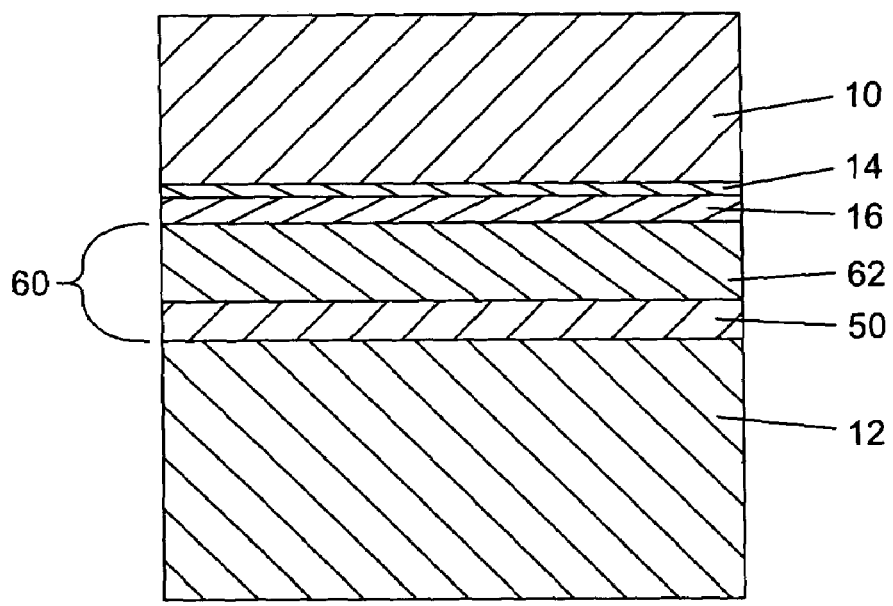
FIG. 6 is a view of the electronic assembly of FIG. 5, after heating of the assembly, in accordance with an embodiment.

When complete the heating yields a structure as shown in FIG. 6, including a thermal interface layer 60 between the heat spreader 12 and the remaining backside metallurgy on the die 10. The thermal interface layer 60 includes a layer 62 including the indium-gold intermetallic, and the layer 50 including the unreacted gold. The thermal interface layer 60 may also include a small amount of indium-nickel intermetallic at or near the interface of the thermal interface layer 60 and the nickel layer 16. The thermal interface layer includes an indium-gold intermetallic having a melting temperature of about 490° C. The backside metallurgy on the die 10 includes the titanium layer 14 and the nickel layer 16 (a small amount of the nickel layer may be reacted with the indium). The gold layer 18 and the gold layer 54 have been reacted with the indium.

Figure 7:
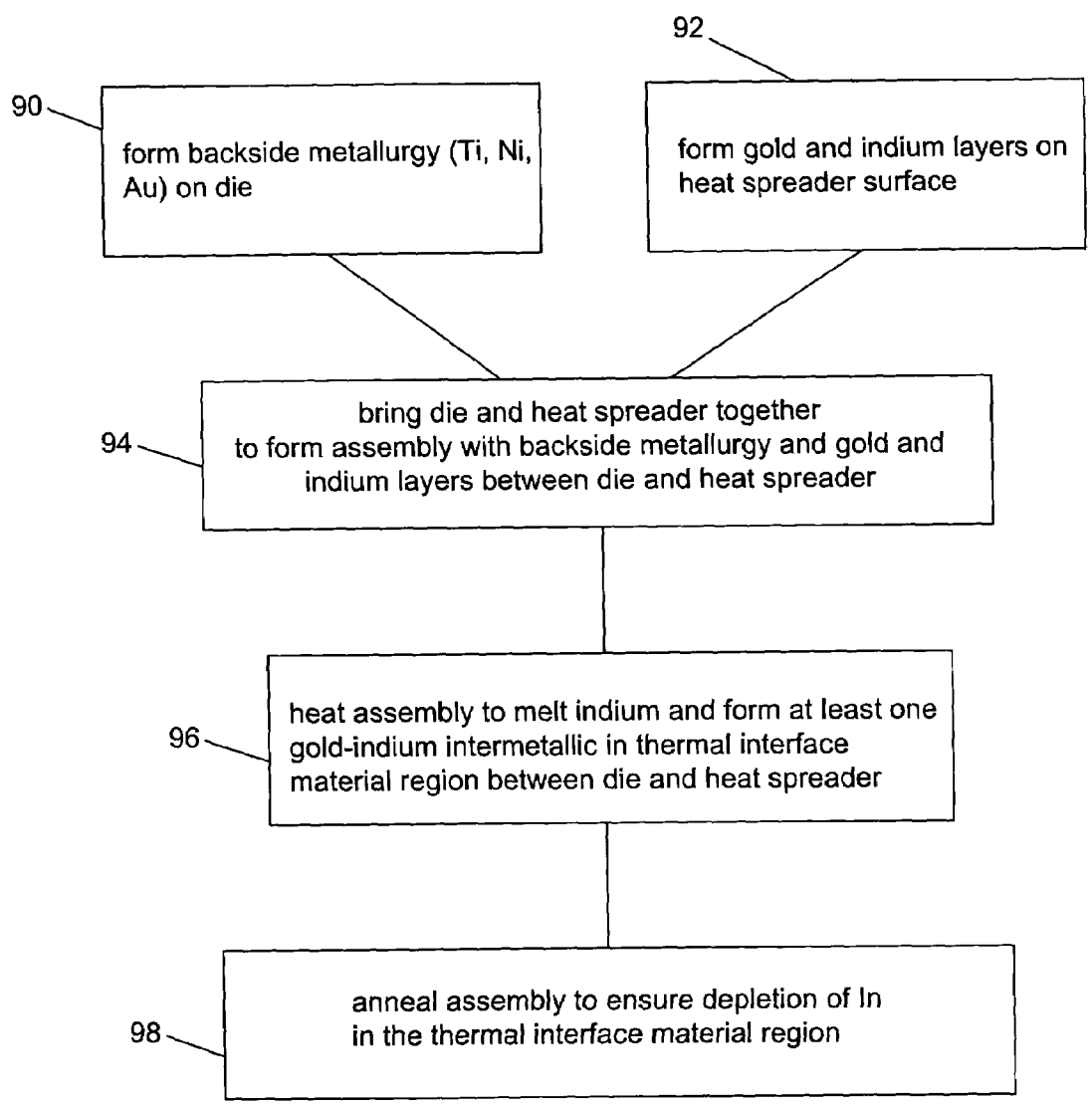
FIG. 7 is a flow chart describing a method for forming an assembly including a die and heat spreader coupled together through a thermal interface layer in accordance with an embodiment.

FIG. 7 illustrates an embodiment in flow chart form describing a method for forming an assembly including a die and heat spreader coupled together through a thermal interface layer including an intermetallic compound formed from gold and indium. Block 90 is forming backside metallurgy (e.g., Ti, Ni, and gold layers) on a die. Block 92 is forming layers of gold and indium on a heat spreader. Block 94 is bringing the die and heat spreader together to form an assembly, with the backside metallurgy and the gold and indium layers being positioned between the die and the heat spreader. Block 96 is heating the assembly to melt the indium and form at least one intermetallic of gold and indium in the thermal interface layer. Block 98 is annealing the assembly to ensure that all of the indium is depleted.

By using lower processing temperatures than other methods, embodiments such as those described above may form assemblies having a lower stress due to thermal expansion mismatch between the die, the thermal interface layer, and the heat spreader. Moreover, by depleting the low temperature material, for example, tin or indium, in the thermal interface layer, the assembly will have a higher temperature resistance due to the absence of pure tin or pure indium and the presence of higher melting point intermetallics in the thermal interface layer. The as-formed thermal interface layer will have a relatively high melting point as noted above. Accordingly, a lower temperature formation joint with higher temperature resistance may be formed.

A variety of modifications to the embodiments may also be made. For example, as described above, a die is attached to the heat spreader. The heat spreader may take a variety of forms, for example, such as a heat sink with one or more fins extending therefrom. Alternatively, a heat spreader could have a relatively simple geometrical form and then be coupled to another heat dissipation structure. In addition, for certain applications, it may be desirable to attach the die to the heat spreader and then to attach the die to a package substrate. In other applications, it may be desirable to attach the die to a package substrate prior to attaching the heat spreader to the die.

In addition, in certain embodiments a variety of materials in addition to those described above may be used. For example, in certain embodiments the heat spreader may be formed from materials other than copper. Other thermally conductive materials may be used. In certain embodiments, a heat spreader may be formed from another material (for example, aluminum) and have a copper layer formed thereon for subsequent attachment to a die by reacting copper with tin. In certain embodiments having a copper layer reacting with a tin layer, it is preferred to have a copper to tin mass ratio of 1.6 to 1 or greater, and a copper to tin layer thickness ratio of 1.4 to 1 or greater.

Figure 8:
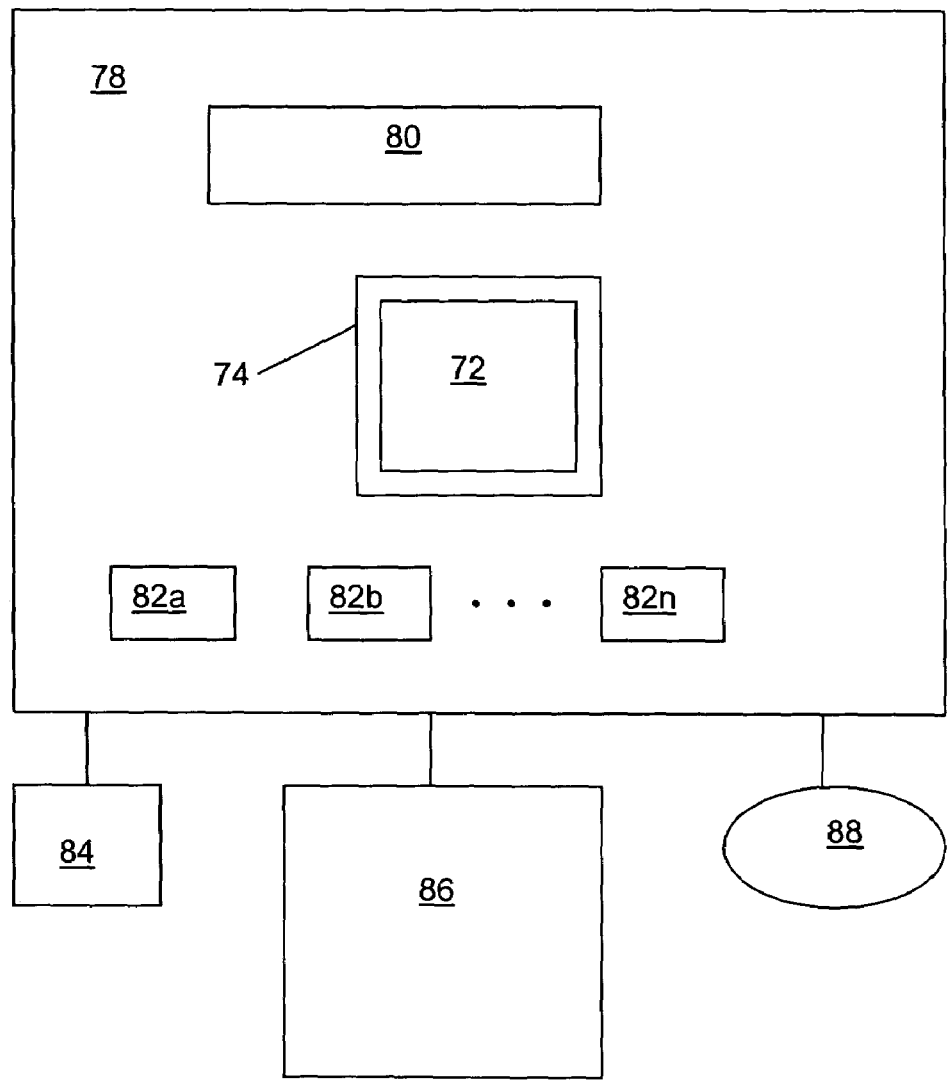
FIG. 8. illustrates one embodiment of a computing environment in which aspects of the description provided herein are embodied.

FIG. 8 illustrates one example of a computing environment in which aspects of described embodiments may be embodied. The computing environment includes a computer 70 including at least one central processing unit (CPU) 72. The CPU 72, also referred to as a microprocessor, may be attached to an integrated circuit package 74 which is then coupled to a printed circuit board 78, which in this embodiment, is a motherboard. The CPU 72 is an example of a die 10 as described earlier. A heat spreader 12 as described above may be coupled to the CPU 72 through a thermal interface material using a method such as described earlier.

The computer 70 further may further include memory 80 and one or more controllers 82a, 82b ... 82n which are also disposed on the motherboard 78. The motherboard 78 may be a single layer or multi-layered board which has a plurality of conductive lines that provide communication between the circuits in the package 74 and other components mounted to the board 78. Alternatively, one or more of the CPU 72, memory 80 and controllers 82a, 82b ... 82n may be disposed on other cards such as daughter cards or expansion cards. The CPU 72, memory 80 and controllers 82a, 82b ... 82n may each be seated in individual sockets or may be connected directly to a printed circuit board. A display 86 may also be included.

Any operating system and various applications as known in the art execute on the CPU 72 and reside in the memory 80. The content residing in memory 80 may be cached in accordance with known caching techniques. Programs and data in memory 80 may be swapped into storage 84 as part of memory management operations. The computer 70 may comprise any computing device known in the art, such as a mainframe, server, personal computer, workstation, laptop, handheld computer, telephony device, network appliance, virtualization device, storage controller, network controller, etc.

The controllers 82a, 82b ... 82n may include a system controller, peripheral controller, memory controller, hub controller, I/O bus controller, video controller, network controller, storage controller, etc. For example, a storage controller can control the reading of data from and the writing of data to the storage 84 in accordance with a storage protocol layer. The storage protocol of the layer may be any of a number of known storage protocols. Data being written to or read from the storage 84 may be cached in accordance with known caching techniques. A network controller can include one or more protocol layers to send and receive network packets to and from remote devices over a network 88. The network 88 may comprise a Local Area Network (LAN), the Internet, a Wide Area Network (WAN), Storage Area Network (SAN), etc. Embodiments may be configured to transmit data over a wireless network or connection. In certain embodiments, the network controller and various protocol layers may employ the Ethernet protocol over unshielded twisted pair cable, token ring protocol, Fibre Channel protocol, etc., or any other network communication protocol known in the art.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed is:

1. A method of forming an electronic assembly, comprising:
   providing a die having a surface;
   providing a heat spreader comprising copper, the heat spreader adapted to transmit heat from the die;
   forming a layer comprising tin on the heat spreader, the tin being positioned between the die and the heat spreader; and
   heating the tin so that the tin melts and forms at least one intermetallic compound with copper from the heat spreader, the heat spreader being coupled to the die through the at least one intermetallic compound, wherein the tin is heated for a sufficient time so that all of the tin is depleted.

2. A method as in claim 1, further comprising forming the layer comprising tin in direct contact with the heat spreader.

3. A method as in claim 1, wherein the heating the tin is carried out at a temperature in the range of 230° C. to 300° C.

4. A method as in claim 1, wherein the heating the tin includes a first heating operation in the range of 230° C. to 300° C. for 2 to 5 minutes and a second heating operation in the range of 230° C. to 280° C. for 1 to 3 hours.

5. A method as in claim 1, further comprising forming a plurality of layers of metal on a back side of the die prior to the heating, and positioning the die so that after the heating, at least one of the plurality of layers is positioned between the die and the at least one intermetallic compound.

6. A method as in claim 1, further comprising forming the plurality of layers of metal to include a first layer comprising titanium, a second layer comprising nickel, and a third layer comprising gold.

7. A method as in claim 1, comprising forming the at least one intermetallic compound to include at least one intermetallic compound having a higher melting point than the tin.

8. A method as in claim 1, comprising forming the at least one intermetallic compound to include $Cu^3Sn$.

9. A method as in claim 1, wherein the heat spreader comprises a base material and a layer comprising copper on the base material.

10. A method as in claim 9, wherein the layer comprising copper and the layer comprising tin are present in amounts so that the copper to tin mass ratio is no smaller than 1.6 to 1.

11. A method as in claim 9, wherein the thickness ratio of the layer comprising copper to the layer comprising tin is no smaller than 1.4 to 1.

12. A method of forming an electronic assembly, comprising:
    providing a die having a surface;
    providing a heat spreader comprising copper, the heat spreader adapted to transmit heat from the die;

forming a layer comprising tin on the heat spreader, the tin being positioned between the die and the heat spreader; and heating the tin so that the tin melts and forms at least one intermetallic compound with copper from the heat spreader, the heat spreader being coupled to the die through the at least one intermetallic compound, wherein the heating the tin includes a first heating operation in the range of 230° C. to 300° C. for 2 to 5 minutes and a second heating operation in the range of 230° C. to 280° C. for 1 to 3 hours.

13. A method as in claim 12, further comprising heating the tin for a sufficient time so that the all of the tin is depleted and formed into at least one intermetallic compound.

14. A method as in claim 12, further comprising forming the layer comprising tin in direct contact with the heat spreader.

15. A method as in claim 12, further comprising forming a plurality of layers of metal on a back side of the die prior to the heating, and positioning the die so that after the heating, at least one of the plurality of layers is positioned between the die and the at least one intermetallic compound.

16. A method as in claim 12, further comprising forming the plurality of layers of metal to include a first layer comprising titanium, a second layer comprising nickel, and a third layer comprising gold.

17. A method as in claim 12, comprising forming the at least one intermetallic compound to include at least one intermetallic compound having a higher melting point than the tin.

18. A method as in claim 12, comprising forming the at least one intermetallic compound to include $Cu_3Sn$.

19. A method as in claim 12, wherein the heat spreader comprises a base material and a layer comprising copper on the base material.

20. A method as in claim 19, wherein the layer comprising copper and the layer comprising tin are present in amounts so that the copper to tin mass ratio is no smaller than 1.6 to 1.

21. A method as in claim 19, wherein the thickness ratio of the layer comprising copper to the layer comprising tin is no smaller than 1.4 to 1.

22. A method of forming an electronic assembly, comprising:

providing a die having a surface;

providing a heat spreader including at least one metal, the heat spreader adapted to transmit heat from the die;

forming a layer comprising tin on the heat spreader, the tin being positioned between the die and the heat spreader; and heating the tin so that the tin melts and forms at least one intermetallic compound with at least one metal from the heat spreader, the heat spreader being coupled to the die through the at least one intermetallic compound, wherein the tin is heated for a sufficient time so that all of the tin is depleted.

23. A method as in claim 22, wherein the heat spreader comprises a base material and a layer comprising metal on the base material.

24. A method as in claim 22, further comprising forming the layer comprising tin in direct contact with the heat spreader.

25. A method as in claim 22, further comprising forming a plurality of layers of metal on a back side of the die prior to the heating, and positioning the die so that after the heating, at least one of the plurality of layers is positioned between the die and the at least one intermetallic compound.

26. A method as in claim 22, further comprising forming the plurality of layers of metal to include a first layer comprising titanium, a second layer comprising nickel, and a third layer comprising gold.

* * * * *